United States Patent
Kunii

(10) Patent No.: US 7,550,328 B2
(45) Date of Patent: Jun. 23, 2009

(54) METHOD FOR PRODUCTION OF THIN-FILM SEMICONDUCTOR DEVICE

(75) Inventor: Masafumi Kunii, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 12/007,302

(22) Filed: Jan. 9, 2008

(65) Prior Publication Data

US 2008/0182368 A1   Jul. 31, 2008

(30) Foreign Application Priority Data

Jan. 31, 2007   (JP) .............................. 2007-020614

(51) Int. Cl.
*H01L 21/84* (2006.01)
*H01L 21/00* (2006.01)
*H01L 33/00* (2006.01)
*H01L 21/425* (2006.01)

(52) U.S. Cl. .................. 438/149; 438/157; 438/652; 438/653; 438/502; 438/509; 257/E21.372; 257/E21.411; 257/E21.077; 257/E21.082

(58) Field of Classification Search .......... 257/E21.372, 257/E21.411, E21.077, E21.082
See application file for complete search history.

(56) References Cited

U.S. PATENT DOCUMENTS

2002/0130363 A1* 9/2002 Yamazaki et al. ........... 257/353
2007/0040172 A1* 2/2007 Kawakami et al. ............ 257/59

FOREIGN PATENT DOCUMENTS

| JP | 04-283967 | 10/1992 |
| JP | 08-293607 | 11/1996 |
| JP | 11-330477 | 11/1999 |
| JP | 2003-124469 | 4/2003 |
| JP | 2003-209261 | 7/2003 |

OTHER PUBLICATIONS

Japanese Office Action issued Feb. 24, 2009 for corresponding Japanese Application No. 2007-020614.

* cited by examiner

*Primary Examiner*—Charles D. Garber
*Assistant Examiner*—Mohsen Ahmadi
(74) *Attorney, Agent, or Firm*—Rader Fishman & Grauer PLLC; Ronald P. Kananen

(57) ABSTRACT

Disclosed herein is a method for production of a thin-film semiconductor device which includes, a first step to form a gate electrode on a substrate, a second step to form a gate insulating film of silicon oxynitride on the substrate in such a way as to cover the gate electrode, a third step to form a semiconductor thin film on the gate insulating film, and a fourth step to perform heat treatment in an oxygen-containing oxidizing atmosphere for modification through oxygen binding with oxygen-deficient parts in the silicon oxynitride film constituting the gate insulating film.

6 Claims, 8 Drawing Sheets

METHOD FOR PRODUCTION OF THIN-FILM SEMICONDUCTOR DEVICE

CROSS REFERENCES TO RELATED APPLICATIONS

The present invention contains subject matter related to Japanese Patent Application JP 2007-020614 filed in the Japan Patent Office on Jan. 31, 2007, the entire contents of which are incorporated herein by reference.

BACKGROUND OF THE INVENTION

1. Field of the Invention

The present invention relates to a method for production of a thin-film semiconductor device and, more particularly, to a method for production of a thin-film semiconductor device of the bottom gate type.

2. Description of the Related Art

Flat panel displays, such as liquid crystal displays and organic EL displays, have thin-film transistors (TFTs) as elements to drive pixel electrodes. Of these TFTs, poly-Si TFTs in which the semiconductor thin film constituting the active layer is made of poly-Si are attracting attention because they form driving circuits and permit highly functional circuits to be built into the panel, thereby giving the so-called system-on-glass structure. Attempts have been made to form poly-Si TFTs on a low-cost glass substrate through the so-called low-temperature poly-Si process which is carried out at 600° C. and under.

Production of poly-Si TFTs through the low-temperature poly-Si process is subject to contamination with impurities, such as metal ions, contained in the insulating substrate, such as glass. Such contamination is usually avoided by a silicon nitride film to exclude the diffusion of impurities, which is interposed between the substrate and the poly-Si film. Unfortunately, the poly-Si film in direct contact with the silicon nitride film deteriorates the characteristic properties of elements on account of fixed charges in the silicon nitride film and interface states originating from the interface of the poly-Si film. Common practice to cope with this situation is the addition of a silicon oxide film onto the silicon nitride film placed underneath the poly-Si film. (See Japanese Patent Laid-open No. 2003-124469)

However, the foregoing two-layer structure is not suitable for TFTs of the bottom gate type with gate electrodes formed underneath the poly-Si film as the active layer, in which the insulating film underneath the poly-Si film functions as the gate insulating film. The two-layered gate insulating film inevitably becomes thick, which is detrimental to high-performance TFTs of the bottom gate type.

One way proposed so far to address this problem is by the use of a silicon oxynitride (SiON) film as the gate insulating film or the underlying insulating film of the poly-Si film. The silicon oxynitride (SiON) film permits a larger ON current to flow for the same gate electrode because silicon oxynitride (SiON) has a higher relative permittivity than silicon oxide ($SiO_2$). In addition, silicon oxynitride (SiON) also stops mobile ions, such as $Na^+$, which contributes to the reliability of TFTs. (See Japanese Patent Laid-open No. 2003-209261) TFTs of the bottom gate type are produced in the following way. First, the substrate has gate electrodes formed thereon, the gate electrodes are covered with a gate insulating film of silicon oxynitride, and the gate insulating film is covered with a semiconductor thin film. Next, the semiconductor thin film is covered with a protective film of silicon oxide for protection of the interface at the back gate side. Finally, the semiconductor film is processed through the protective film.

SUMMARY OF THE INVENTION

As mentioned above, the disadvantage of TFTs of the bottom gate type having a silicon oxynitride (SiON) film as the underlying gate insulating film for poly-Si film is that the silicon oxynitride (SiON) film still has more fixed charges and interface states than silicon oxide ($SiO_2$) film although it has less interface states than silicon nitride (SiN) film. Therefore, fixed charges in the silicon oxynitride (SiON) film cause the Vth of TFT to greatly shift toward the minus side, with ON current deteriorating with time.

It is an embodiment of the present invention to provide a method for production of a thin-film semiconductor device or a highly reliable TFT of the bottom gate type, while decreasing fixed charges in the gate insulating film and also decreasing interface states, without the necessity of increasing the thickness of the underlying gate insulating film for the silicon film as the active layer and also without the necessity of increasing the number of processing steps.

According to an embodiment of the present invention, to achieve the above-mentioned object, the method for production of a thin-film semiconductor device includes the following steps. The first step is to form gate electrodes on a substrate. The second step to form at least either a silicon oxynitride film or a silicon oxide film covering the gate electrodes on the substrate. The third step is to form a semiconductor film on the gate insulating film. The forth step is heat treatment in an oxidizing atmosphere containing oxygen, for modification with oxygen that binds to oxygen deficient parts in the silicon oxynitride film or silicon nitride film constituting the gate insulating film.

According to an embodiment of the present invention, the method mentioned above includes the fourth step for heat treatment in an oxygen-containing atmosphere, with a semiconductor film covering the gate insulating film. This step causes oxygen in the oxidizing atmosphere to reach the gate insulating film through the semiconductor film, thereby supplying oxygen to oxygen deficient parts in the gate insulating film. This procedure eliminates fixed charges in the gate insulating film of silicon oxynitride and interface states between the semiconductor film and the gate insulating film.

In addition, the heat treatment mentioned above causes an oxide film to grow as the surface of the semiconductor film is oxidized. The resulting thermal oxide film protects the surface of the semiconductor film (or the back gate face).

As mentioned above, the method of the embodiments of the present invention brings about a modification of the silicon oxynitride film underneath the semiconductor thin film as the active layer. This modification decreases fixed charges in the gate insulating film of silicon oxynitride and also decreases interface states without the necessity of making the gate insulating film thicker. Moreover, this modification also forms a protective film on the surface of the semiconductor thin film. The decrease of fixed charges in the gate insulating film and the decrease of interface states are achieved without additional steps. The result is a highly reliable TFT of the bottom gate type.

DETAILED DESCRIPTION OF THE PREFERRED EMBODIMENTS

The embodiments of the present invention will be described below in more detail with reference to the accompanying drawings.

First Embodiment

FIGS. 1A to 1J are sectional views showing steps in the first embodiment of the method for production of a thin-film semiconductor device according to an embodiment of the present invention. The embodiment mentioned below is intended for the drive panel of the display-unit provided with TFTs of the planar bottom gate type in the form of CMOS.

Figure 1A:
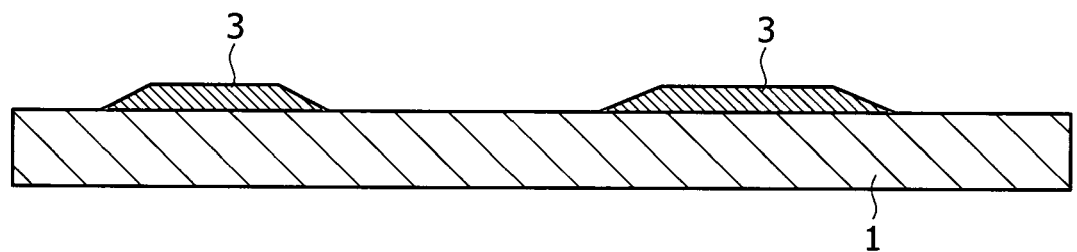
FIGS. 1A to 1C are sectional views showing steps in the first embodiment of the method for production of a thin-film semiconductor device (Part 1)

The first step, shown in FIG. 1A, starts with getting ready an insulating substrate 1, which may be "AN100" from Asahi Glass CO. LMT. or "Code 1737" from Corning Incorporated, for example.

The substrate 1 has gate electrodes 3 formed thereon by patterning. The gate electrodes 3 are formed from film of Mo, W, Ta, or Cu by sputtering and ensuing patterning.

Incidentally, the thickness of the gate electrode (metal film) should be 30 to 200 nm.

Figure 1B:
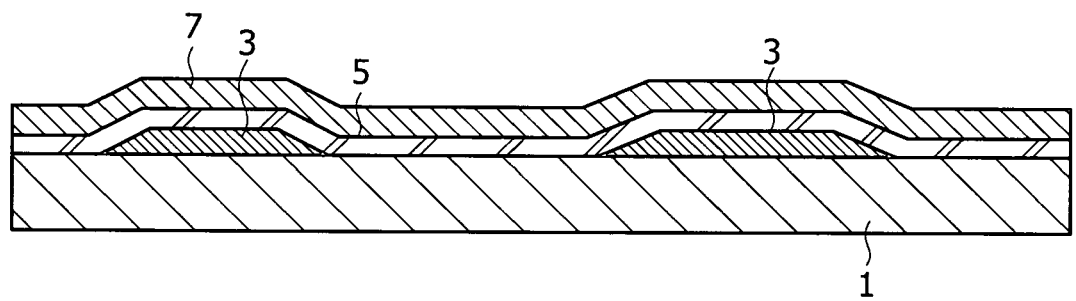

The next step, shown in FIG. 1B, is intended to form a gate insulating film of silicon oxynitride ($SiO_xN_y$) 5 (which will be referred to as SiON gate insulating film hereinafter) on the gate electrodes 3 by plasma CVD or LPCVD. Using plasma CVD to form the SiON gate insulating film 5 may employ inorganic silane gas, nitrogen monoxide ($N_2O$), and nitrogen ($N_2$) for film deposition. Incidentally, the substrate should be kept preferably at about 350 to 450° C. during film deposition.

The next step is intended to coat the SiON gate insulating film with a semiconductor thin film 7 of silicon or silicon-germanium, 10 to 100 nm thick, preferably 40 nm thick, by plasma CVD, reactive thermal CVD, or reduced pressure CVD. The semiconductor thin film 7 may be of an amorphous phase, a microcrystalline phase, or a polycrystalline phase.

In the next step, the semiconductor thin film 7 of amorphous phase is irradiated with a pulse excimer laser or beams or a xenon arc lamp, or sprayed with plasma jets, so that the amorphous phase is crystallized. The semiconductor thin film 7 of crystalline phase or micro- or poly-crystalline phase also may be irradiated with energy in the same way as above according to need. This step eliminates defects in polycrystals constituting the semiconductor thin film 7, by melting and ensuing recrystallization that enlarges crystal grains, or without melting, and promotes crystallinity of the material constituting the semiconductor thin film 7.

Energy irradiation may be accomplished by using an excimer laser of xenon chloride (XeCl) which emits line beams with a wavelength of 308 nm and a pulse repeating frequency of about 200 Hz. The energy density for irradiation should be 200 to 400 mJ/cm$^2$.

Figure 1C:
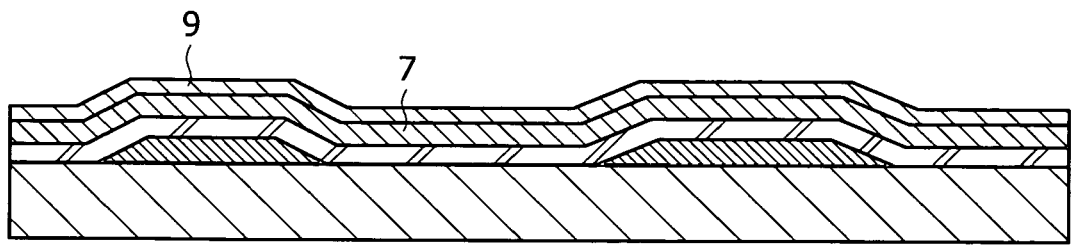

The foregoing steps are followed by the step shown in FIG. 1C, which is characteristic of the embodiment of the present invention. This step is heat treatment in an oxygen containing-oxidizing atmosphere, which is intended to modify the SiON gate insulating film 5 and also to grow a thermal oxide film 9 on the surface of the semiconductor thin film 7. This heat treatment employs steam pressurized at 2 MPa or above, so that it produces the effect of "steam annealing under pressure".

Steam annealing under pressure should be carried out at a temperature from 200° C. to 600° C., preferably higher than 450° C. and lower than 600° C., and at a pressure higher than 1 MPa. The temperature and pressure higher than 450° C. and 1 MPa, respectively, are necessary for modification of the SiON gate insulating film 5 underneath the semiconductor thin film 7. The heating temperature should be lower than 600° C. for the glass substrate 1.

The object of steam annealing under pressure is to make oxygen combine with oxygen-deficient parts in the SiON gate insulating film 5 underneath the semiconductor thin film 7, thereby eliminating fixed charges due to an oxygen deficiency. Another object is to grow the thermal oxide film 9 (with a thickness of 0.5 to several nanometers) on the surface of the semiconductor thin film 7.

The steam annealing is followed by optional ion implantation with B$^+$ ions (at an approximate dosage of 0.1E12-4E12/cm$^2$) so that the resulting thin-film transistor has an adequately controlled Vth. The ion beams should be accelerated at a voltage of about 20 to 200 keV.

Figure 1D:
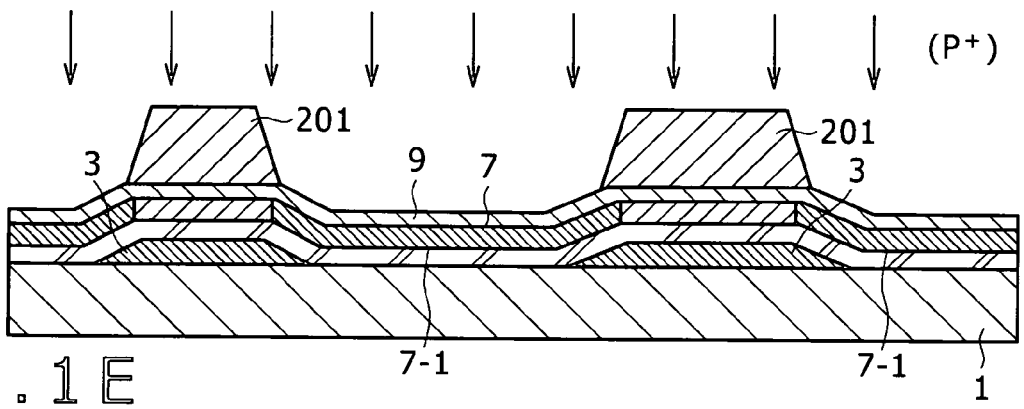
FIGS. 1D to 1G are sectional views showing steps in the first embodiment of the method for production of a thin-film semiconductor device (Part 2)

The next step, shown in FIG. 1D, is intended to form a resist pattern 201 on the thermal oxide film 9 by back surface exposure through the substrate 1, with the gate electrodes 3 functioning as the mask. Then, ion implantation for the introduction of impurities through the resist pattern 201 as the mask is carried out to form the LDD diffusion layer 7-1 for the n-type MOS transistor in the semiconductor thin film 7. The ion implantation, which may be of a mass separation type or a non-mass separation type, should operate at an accelerating voltage of about 20 to 200 keV for P$^+$ ions at a dosage of 6E12-5E13/cm$^2$. After ion implantation, the resist pattern 201 is peeled off.

Figure 1E:
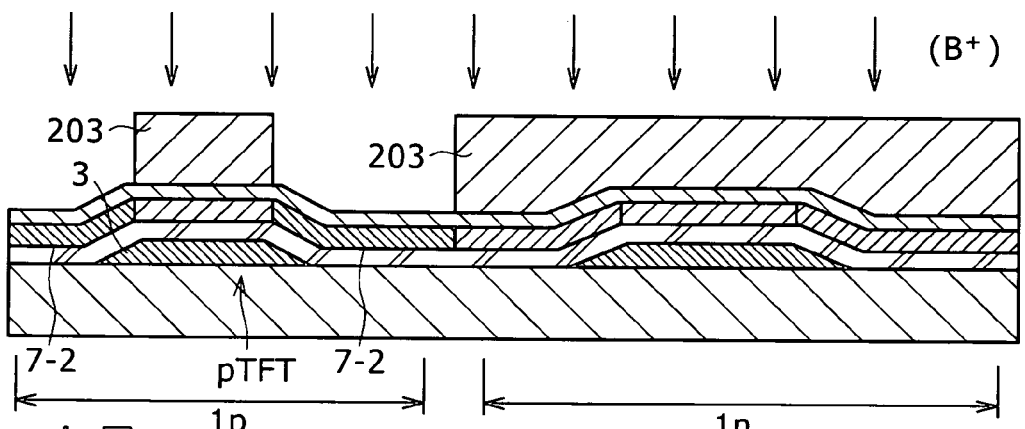

The next step, shown in FIG. 1E, is intended to form a resist pattern 203 which covers the top of the gate electrode 3 in the p-channel region 1p and also entirely covers the n-channel region 1n. Then, ion implantation for the introduction of impurities through the resist pattern 203 as the mask is carried out to form the source-drain 7-2 of the p-channel thin-film transistor. The ion implantation, which may be of a mass separation type or a non-mass separation type, should operate at an accelerating voltage of about 5 to 100 keV for B$^+$ ions at a dosage of 1E14-3E15/cm$^2$. In this way the p-channel thin film transistor (pTFT) is formed. After ion implantation, the resist pattern 203 is peeled off.

Figure 1F:
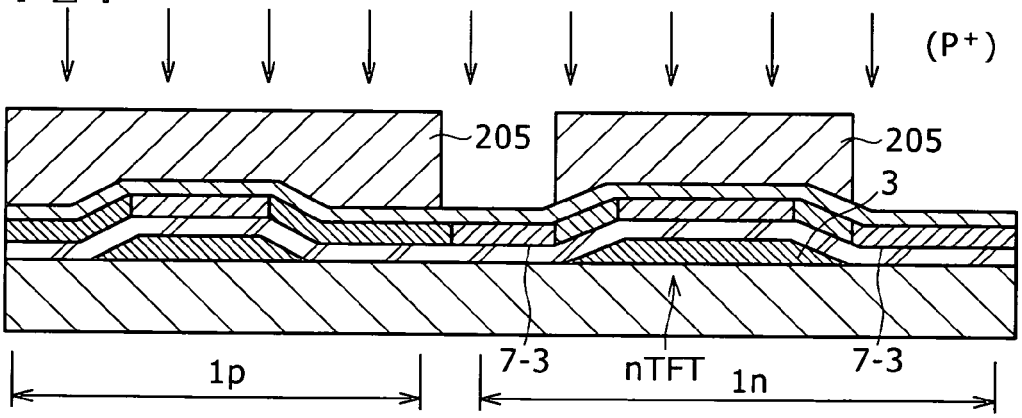

The next step, shown in FIG. 1F, is intended to form a resist pattern 205 which entirely covers the n-channel region 1p and also covers the top of the gate electrode 3 in the n-channel region 1n. Then, ion implantation for the introduction of impurities through the resist pattern 205 as the mask is carried out to form the source-drain 7-3 of the n-channel thin-film transistor. The ion implantation should operate at an accelerating voltage of about 10 to 200 keV for $P^+$ ions at a dosage of 1E15-3E15/cm². In this way the n-channel thin film transistor (nTFT) is formed. After ion implantation, the resist pattern 205 is peeled off.

The ion implantation is followed by the activation of impurities introduced into the semiconductor thin film 7. This activation is accomplished by infrared lamp heating, RTA (rapid thermal annealing in a burning furnace), laser annealing, or furnace annealing in an atmosphere of $N_2$ at 600° C. or below.

Figure 1G:
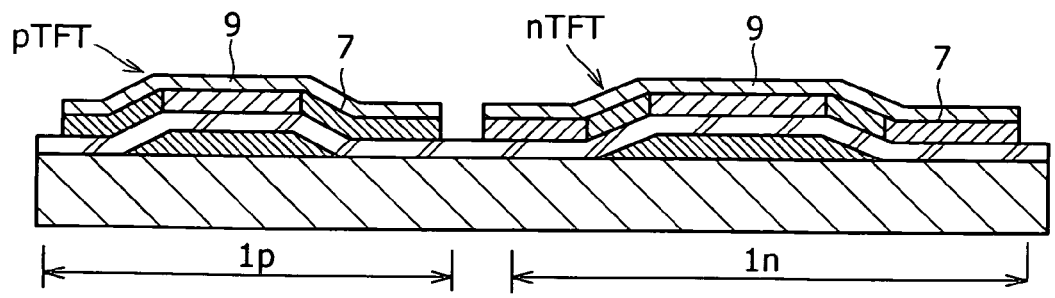

The next step, shown in FIG. 1G, is intended to perform pattern etching simultaneously on the thermal oxide film 9 and the semiconductor thin film 7. This patterning forms separated thin-film transistors (pTFT and nTFT).

In the foregoing steps shown in FIGS. 1D to 1G, the thermal oxide film 9 functions as a protective film on the surface (back gate face) of the semiconductor thin film 7. The protective film protects the back gate face of the semiconductor thin film 7 from being damaged during processing.

Figure 1H:
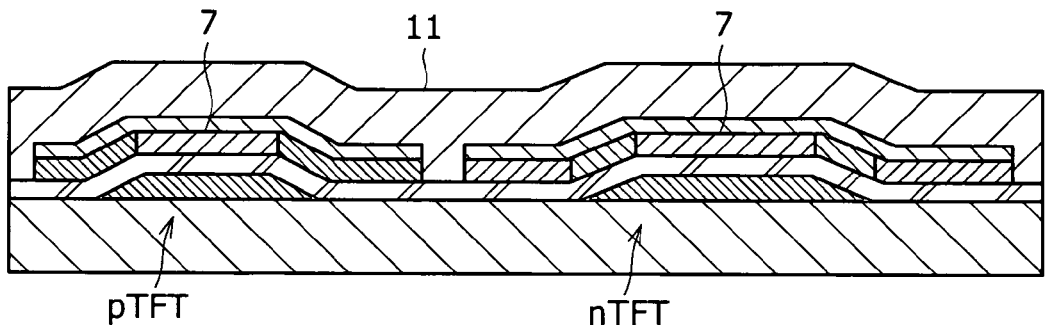
FIGS. 1H to 1J are sectional views showing steps in the first embodiment of the method for production of a thin-film semiconductor device (Part 3)

The next step, shown in FIG. 1H, is intended to form an interlayer insulating film 11 that covers the individually separated thin-film transistors pTFT and nTFT. The interlayer insulating film 11 should be of a layer structure composed of a silicon oxide thin film and a hydrogen-containing silicon nitride thin film arranged upward in the order mentioned. This process may be accomplished by plasma CVD, for example.

At this stage, the intermediate product optionally undergoes annealing in an inert gas or forming gas. This annealing causes hydrogen in the interlayer insulating film 11 (particularly hydrogen in silicon nitride) to diffuse into the semiconductor thin film 7 for hydrogenation. The preferred annealing condition is 400° C. and 2 hours. This hydrogenation eliminates dangling bonds in the semiconductor thin film 7 of microcrystalline silicon, thereby improving the TFT characteristics. This annealing may be omitted if the steam annealing under pressure shown in FIG. 1C produces the effect of hydrogenation satisfactorily.

Figure 1I:
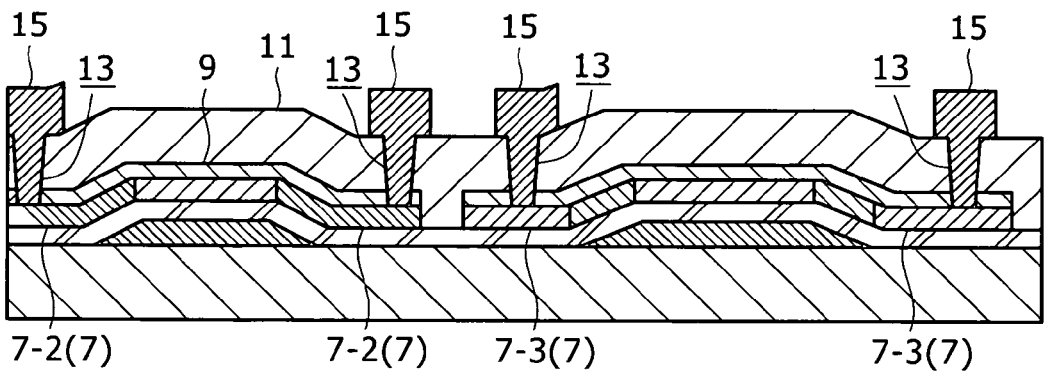

The next step, shown in FIG. 1I, is intended to form contact holes 13 that reach the source-drain 7-2 and 7-3 of the semiconductor thin film 7 in the interlayer insulating film 11 and the thermal oxide film 9, respectively. Then, the wiring electrode 15, which is connected to the source-drain 7-2 and 7-3 through the contact hole 13, is formed on the interlayer insulating film 11. This process is accomplished by forming a film of Al—Si for the wiring electrode by sputtering and then patterning the thus formed film.

Figure 1J:
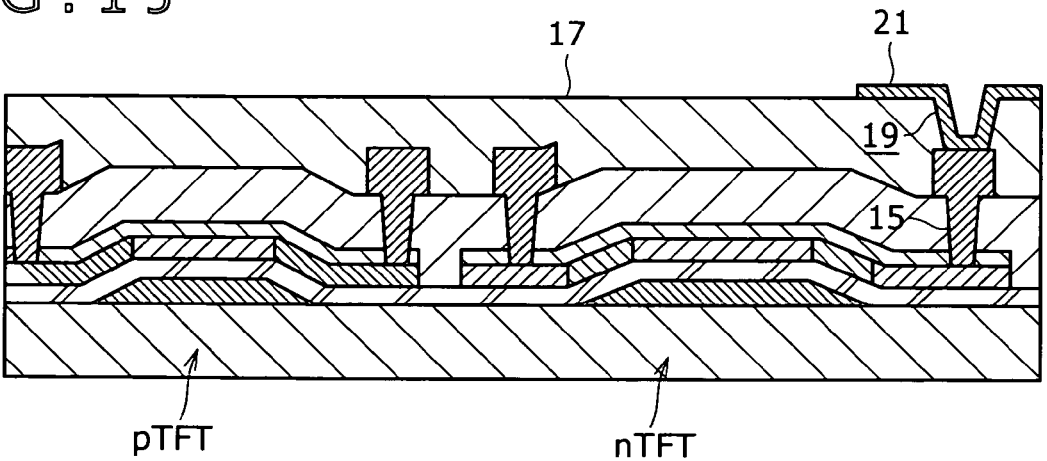

The next step, shown in FIG. 1J, is intended to form a planarized insulating film 17 (about 1 µm thick) from an acrylic organic resin. In this planarizing insulating film 17, a contact hole 19 reaching the wiring electrode 15 is formed. On this planarized insulating film 17, a pixel electrode 21 connected to the wiring electrode 15 through the contact hole 19 is formed. The pixel electrode 21 is formed by sputtering from ITO (indium tin oxide), which is a transparent conductive material, followed by patterning. The pixel electrode 21 formed from ITO is annealed in a nitrogen atmosphere at about 220° C. for 30 minutes. In this way, the drive panel for display is completed.

As shown in FIG. 1J, the drive panel for the display unit has a n-channel thin-film transistor nTFT as the pixel transistor to drive the pixel electrode, a peripheral circuit of CMOS structure, and a p-channel thin-film transistor pTFT constituting part of the peripheral circuit.

The foregoing steps complete the drive panel. The subsequent step varies depending on the type of the display unit to be formed thereon. For a liquid-crystal display unit, the pixel electrodes 21 are covered with an alignment layer. Above the alignment layer is placed another substrate having electrodes and an alignment layer formed in the same way as above, with the alignment layers facing each other, and the gap between them is filled with a liquid crystal. For an organic EL display unit with organic electroluminescent elements, the pixel electrodes 21 are covered with an organic layer containing a luminescent layer and then electrodes are formed on the organic layer. Finally, if necessary, the electrodes are covered with a protective film to complete the display unit.

The production method mentioned above is characterized by steam annealing under pressure which is performed after the semiconductor thin film 7 has been formed on the SiON gate insulating film 5, as illustrated in FIG. 1C. Annealing in such a way causes steam to penetrate the semiconductor thin film 7 and reach the underlying SiON gate insulating film 5, so that oxygen binds to oxygen-deficient parts in the SiON gate insulating film 5. The oxygen binding eliminates fixed charges in the SiON gate insulating film 5 and interface states between the semiconductor thin film and the gate insulating film. This prevents the threshold voltage from shifting.

In addition, steam annealing under pressure in this way also oxidizes the surface of the semiconductor film 7, thereby forming the thermal oxide film 9, which functions as a protective film for the top (back gate face) of the semiconductor thin film 7.

The process mentioned above forms the gate insulating film underneath the semiconductor thin film 7 as the active layer, without the former getting thick, and also forms the thermal oxide film 9 which functions as a protective film on the surface of the semiconductor thin film 7 at the same time as the SiON gate insulating film is modified. Therefore, it yields a highly reliable TFT of bottom gate type without increasing the number of steps.

Thus, the TFT of bottom gate type, which has the gate insulating film of SiON having a higher relative permittivity than $SiO_2$, provides improved reliability, consistent characteristics, and increased ON current.

Figure 2:
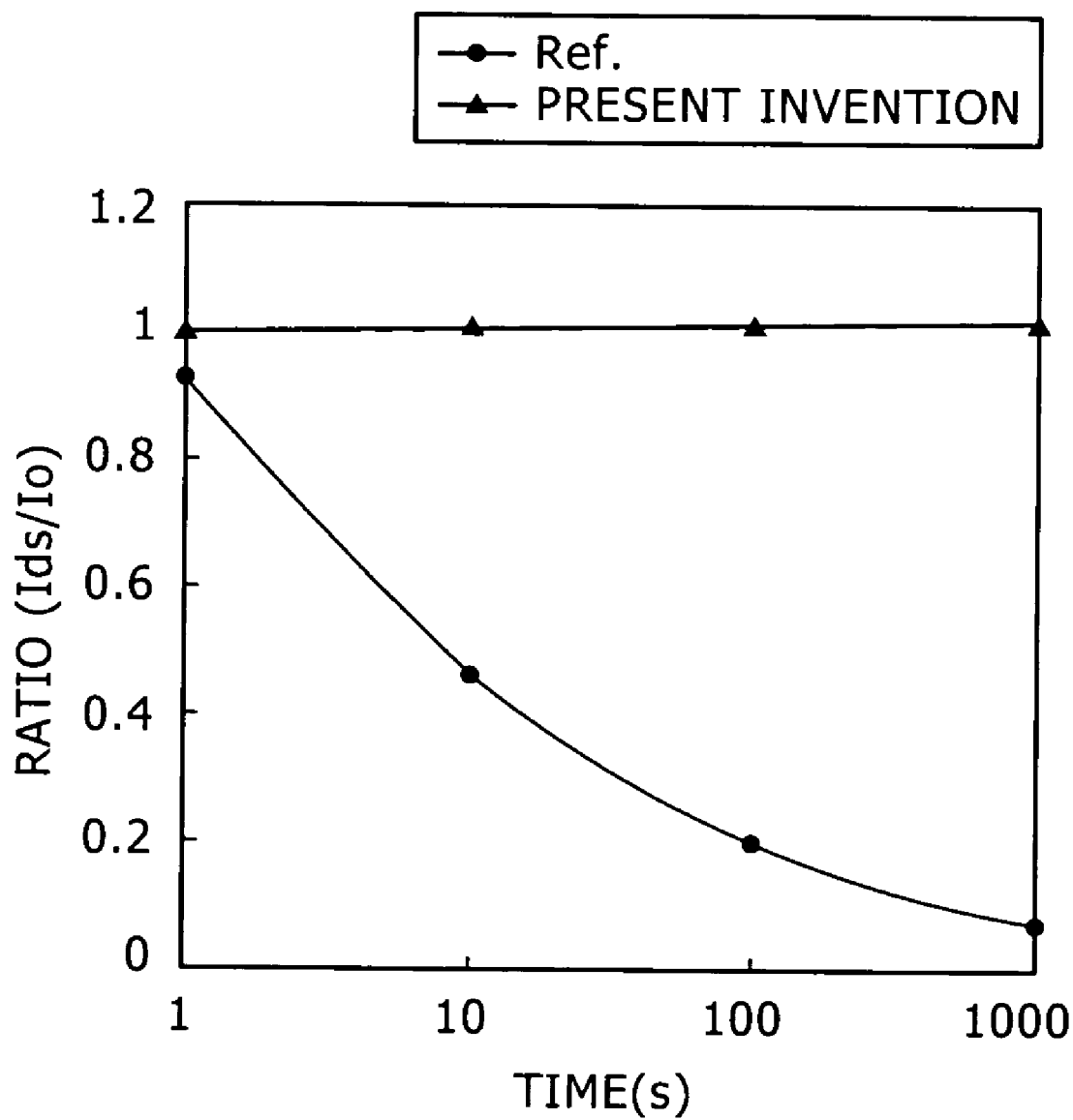
FIG. 2 is a graph showing the effect of the first embodiment in terms of the TFT characteristics that deteriorate with time.

FIG. 2 is a graph showing how the characteristic properties deteriorate with time in the case of the thin film transistor of n-channel type produced according to the first embodiment and in the case of the thin film transistor (of n-channel type) produced in the comparative example in which modification of the gate insulating film was omitted. The former is indicated by "Ref", and the latter is indicated by "Embodiment of the Present Invention". In FIG. 2, the abscissa represents time and the ordinate represents current in terms of ratio $I_{ds}/I_0$, where $I_0$ is the initial current at time $0_s$ on the abscissa. Stress was applied by keeping the gate voltage and drain voltage at 15 V. Stress application under this condition causes the thin-film transistor of n-channel type (pTFT) to deteriorate due to hot electrons injected into the gate insulating film.

It is apparent from FIG. 2 that the comparative sample begins to deteriorate within one second immediately after stress application, but the sample according to the embodiment of the present invention remains almost unchanged in current throughout the period of 1000 seconds after stress application. This proves that the steps according to the first embodiment cause oxygen to bind with the oxygen-deficient parts in the SiON gate insulating film, thereby forming a compact layer and making the SiON gate insulating film resistant to hot electrons being injected.

It was also confirmed that the sample according to the embodiment of the present invention is less than the comparative sample in variation of the threshold value (Vth) in the surface of the substrate by more than 30% in terms of standard deviation. It was further confirmed that the sample prepared as mentioned above deteriorates very little when it was subjected to stress with a large current.

Second Embodiment

FIGS. 3A to 3F are sectional views showing steps in the second embodiment of the method for production of a thin-film semiconductor device according to the embodiment of the present invention. The embodiment mentioned below is intended for the drive panel of the display unit provided with bottom gate TFTs of channel stop type with the n-channel only.

The same procedure as mentioned above for the first embodiment with reference to FIGS. 1A to 1C are repeated to cover the gate electrodes 3 on the insulating substrate 1 sequentially with the SiON gate insulating film 5 and the semiconductor thin film 7 and then perform steam annealing under pressure for modification of the SiON gate insulating film 5 and growth of the thermal oxide film 9 on the surface of the semiconductor thin film 7.

Figure 3A:
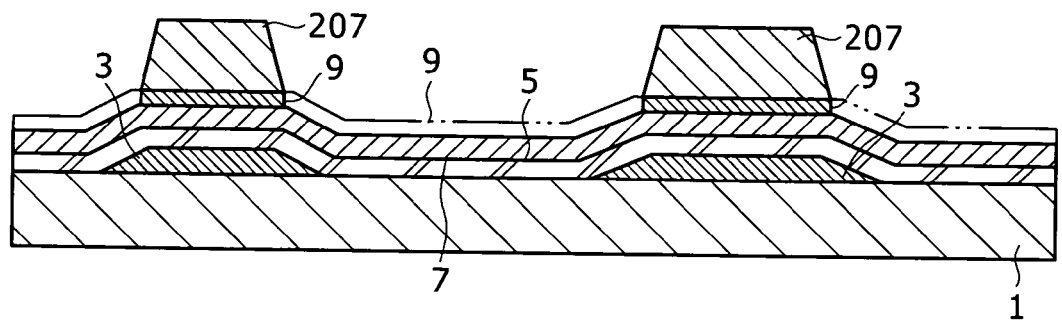
FIGS. 3A to 3C are sectional views showing steps in the second embodiment of the method for production of a thin-film semiconductor device (Part 1)

The next step, shown in FIG. 3A, is intended to form a resist pattern 207 which overlaps the gate electrode 3 on the thermal oxide film 9 by back surface exposure through the substrate 1, with the gate electrodes 3 functioning as the mask. Then, the thermal oxide film 9 undergoes etching through the resist pattern 207 as the mask, so that the thermal oxide film 9 which overlaps the gate electrode 3 is patterned. After etching, the resist pattern 207 is peeled off.

Figure 3B:
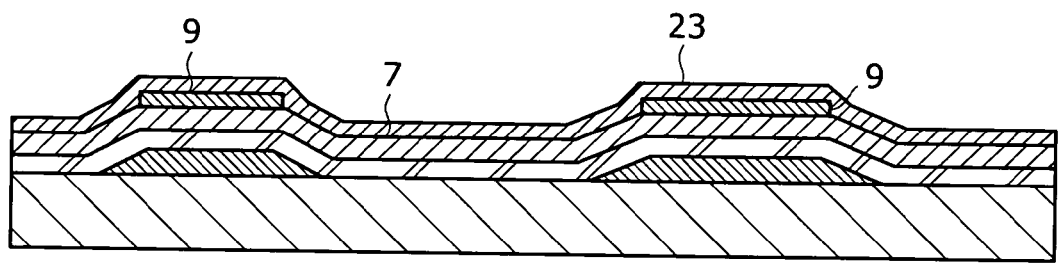

The next step, shown in FIG. 3B, is intended to form a n-type semiconductor thin film 23 (10 to 500 nm thick) of silicon containing activated n-type impurities, by plasma CVD or reactive thermal CVD which employs silane ($SiH_4$) and phosphine ($PH_3$) as a dopant. If the dopant is replaced by diborane ($B_2H_6$), the resulting n-type semiconductor thin film will contain p-type impurities.

Now, the previously formed semiconductor thin film 7 functions as the channel layer 7 and the dopant-containing n-type semiconductor thin film 23, which has been formed in this step, functions as the source-drain layer 23.

Figure 3C:
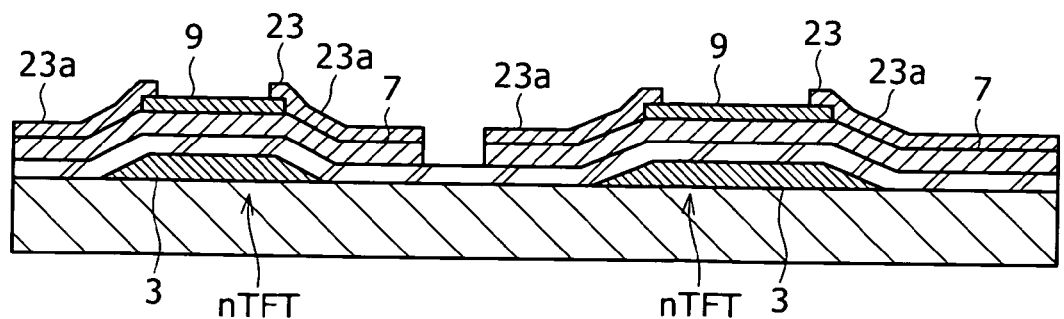

The next step, shown in FIG. 3C, is intended to perform etching on the source-drain layer 23 and the channel layer 7 together according to the pattern on the source-drain layer 23, so that the thin film transistor is divided into individual regions. Etching of the source-drain layer 23 employs the thermal oxide film 9 as an etching stopper to protect the channel layer (semiconductor thin film) 7, so that the source drain layer 23 is divided on the thermal oxide film 9. In this way the source-drain 23a in contact with the channel layer (semiconductor thin film) 7 is formed such that its opening coincides with the gate electrode 3. The foregoing step is followed by a step to form the n-type thin film transistor nTFT of channel stop type in which the thermal oxide film 9 protects the channel part which is in the channel layer 7 and above the gate electrode 3.

Figure 3D:
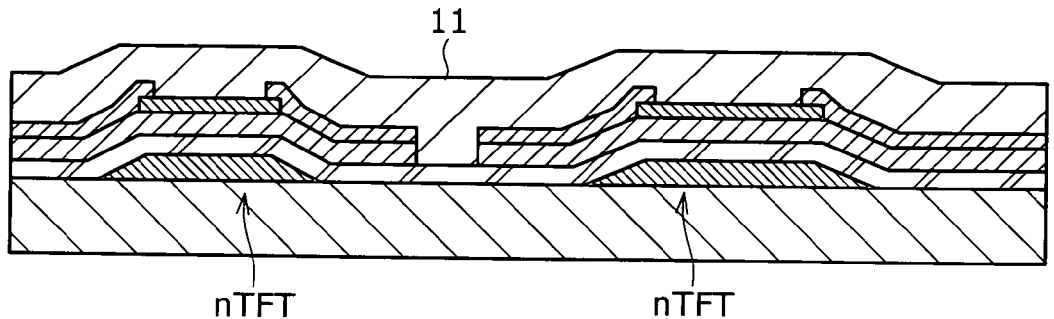
FIGS. 3D to 3F are sectional views showing steps in the second embodiment of the method for production of a thin-film semiconductor device (Part 2)
Figure 3E:
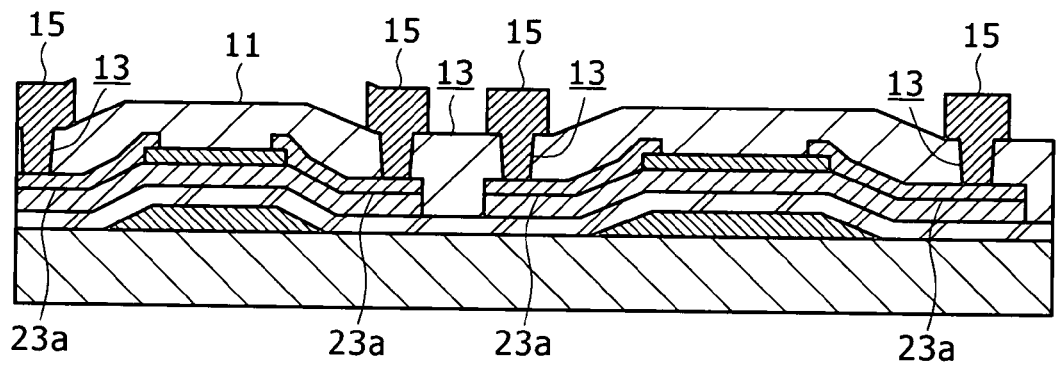
Figure 3F:
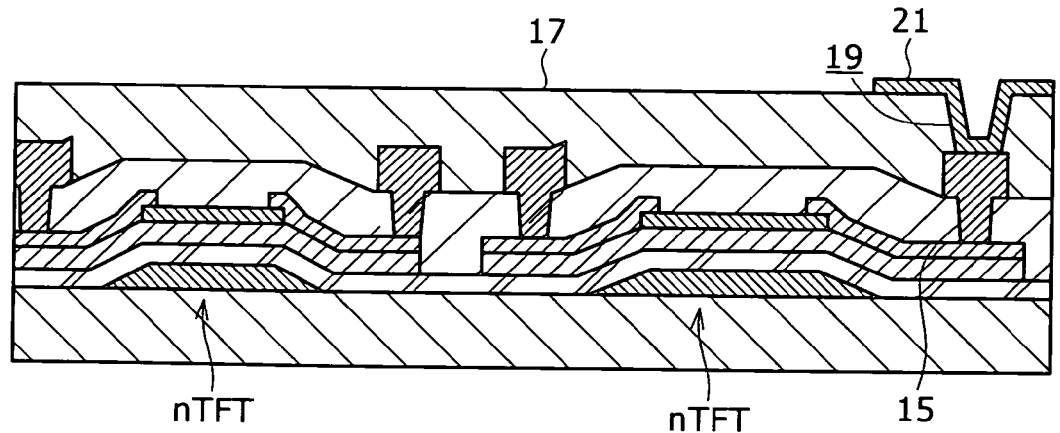

The subsequent steps shown in FIGS. 3D to 3F are the same as those in the first embodiment, which have been described above with reference to FIGS. 1H to 1J.

The step shown in FIG. 3D is intended to form an interlayer insulating film 11 covering the thin film transistor nTFT, which has been formed in the previous step. This step is followed by hydrogenation.

The next step, shown in FIG. 3E, is intended to process the interlayer insulating film 11 to form contact holes 13 therein, which reach the source-drain 23a. Then, the contact holes 13 are plugged with wiring electrodes 15, which reach the source-drain 23a.

The next step shown in FIG. 3F is coating with a planarized insulating film 17, which is subsequently processed to form therein a contact hole 19 reaching the wiring electrode 15 of the thin-film transistor nTFT as the pixel transistor. Then, the contact hole 19 is plugged with a pixel electrode 21 for connection to the wiring electrode 15.

Thus, the foregoing steps complete the drive panel. On the drive panel the display unit is subsequently formed in the same way as used in the first embodiment.

The second embodiment is as effective as the first embodiment because it involves steam annealing under pressure which is carried out, with the semiconductor thin film 7 formed on the SiON gate insulating film 5, as illustrated by FIG. 1C in the latter.

Although the second embodiment illustrates the bottom gate TFT of the channel stop type which has only one n-channel, it may give a transistor of CMOS structure if the microcrystalline silicon thin film 23 is formed twice for the n-type and the p-type. Moreover, the transistor may be combined with a p-channel thin-film transistor of any other type.

Third Embodiment

FIGS. 4A to 4E are sectional views showing steps in the third embodiment of the method for production of a thin-film semiconductor device according to the embodiment of the present invention. The embodiment mentioned below is intended for the drive panel of the display unit provided with dual gate TFTs of the CMOS type.

The same procedure as mentioned above for the first embodiment with reference to FIGS. 1A to 1C is repeated to cover the gate electrodes 3 on the insulating substrate 1 sequentially with the SiON gate insulating film 5 and the semiconductor thin film 7 and then perform steam annealing under pressure for modification of the SiON gate insulating film 5 and growth of the thermal oxide film 9 on the surface of the semiconductor thin film 7. The foregoing steps are followed by the same procedure as described above with reference to FIGS. 1D to 1G, by which both the thermal oxide film 9 and the semiconductor thin film 7 undergo pattern etching so that they are divided into individual thin-film transistors pTFT and nTFT.

Figure 4A:
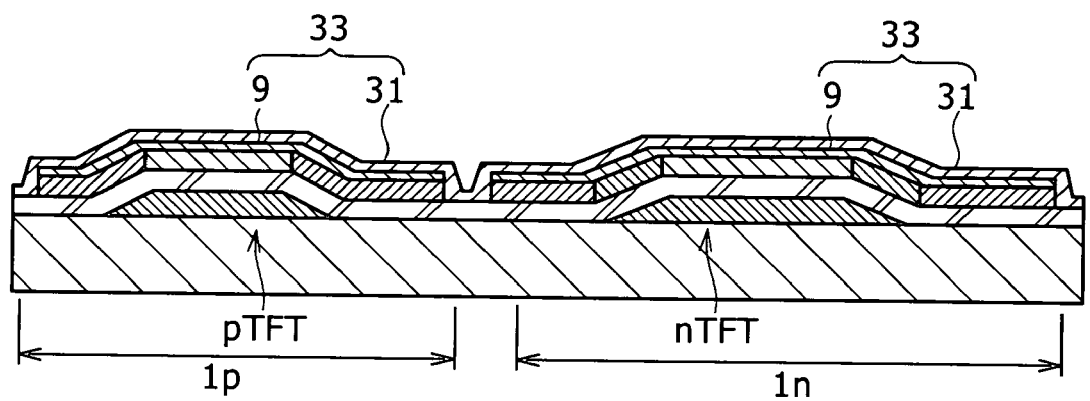
FIGS. 4A and 4B are sectional views showing steps in the third embodiment of the method for production of a thin-film semiconductor device (Part 1)

The next step, shown in FIG. 4A, is intended to form the insulating film 31 of silicon oxide, silicon oxynitride, or silicon nitride by plasma CVD such that it covers the thin film transistors pTFT and nTFT. This insulating film 31 in combination with the previously formed thermal oxide film 9 constitutes the upper insulating film 33.

Figure 4B:
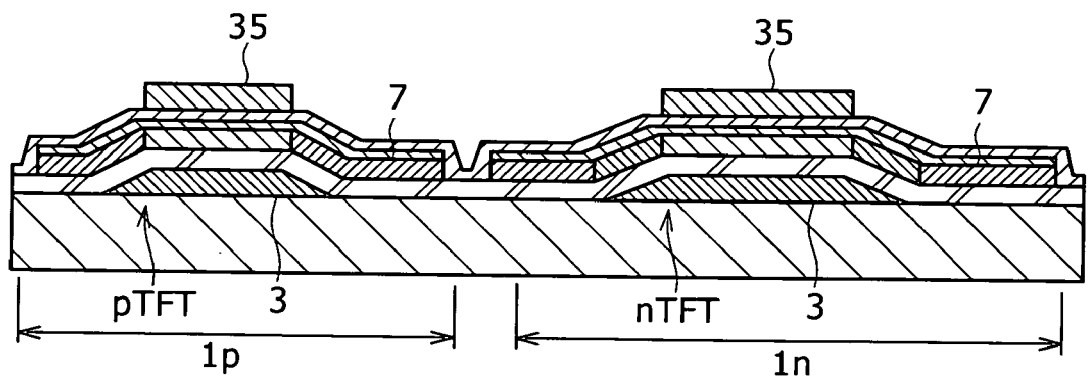

The next step, shown in FIG. 4B, is intended to form the upper gate electrode 35 on the upper gate insulating film 33, the former overlapping the gate electrode 3. The upper gate electrode 35 is a metal film (30 to 200 nm thick) formed by sputtering from Mo, W, Ta, or Cu and subsequent patterning.

The foregoing steps complete the thin-film transistor pTFT and nTFT of dual gate structure, in which two gate electrodes 3 and 35 hold the semiconductor thin film 7 between them.

Figure 4C:
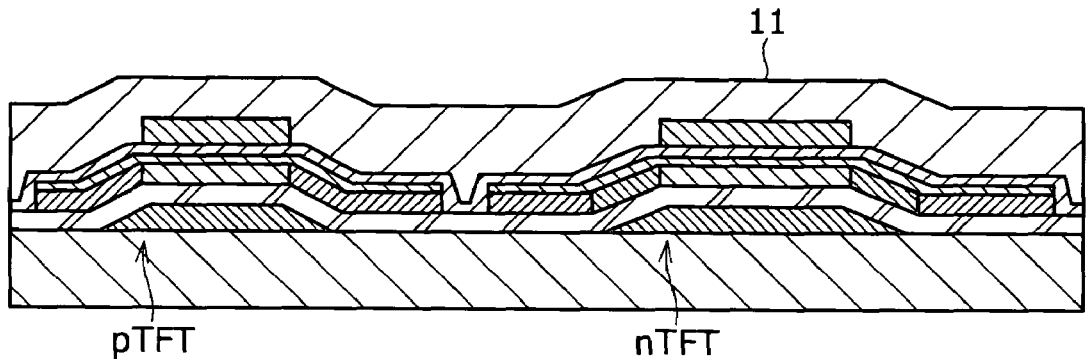
FIGS. 4C to 4E are sectional views showing steps in the third embodiment of the method for production of a thin-film semiconductor device (Part 2).
Figure 4D:
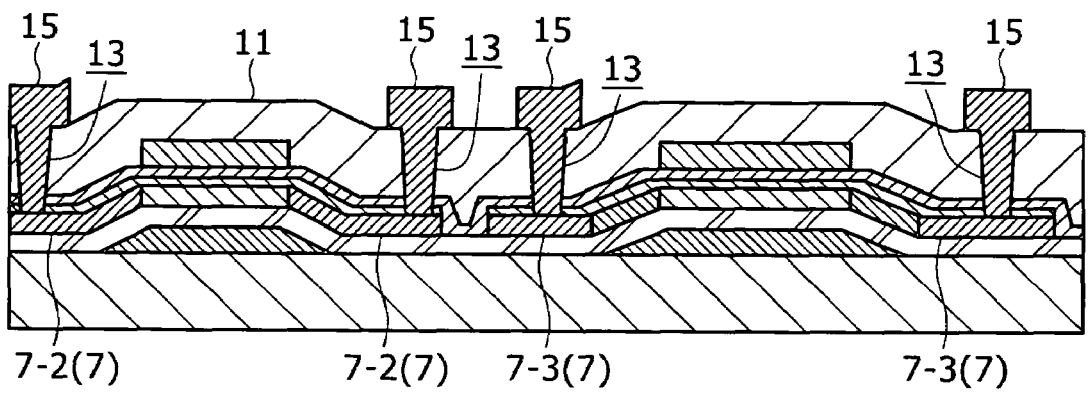
Figure 4E:
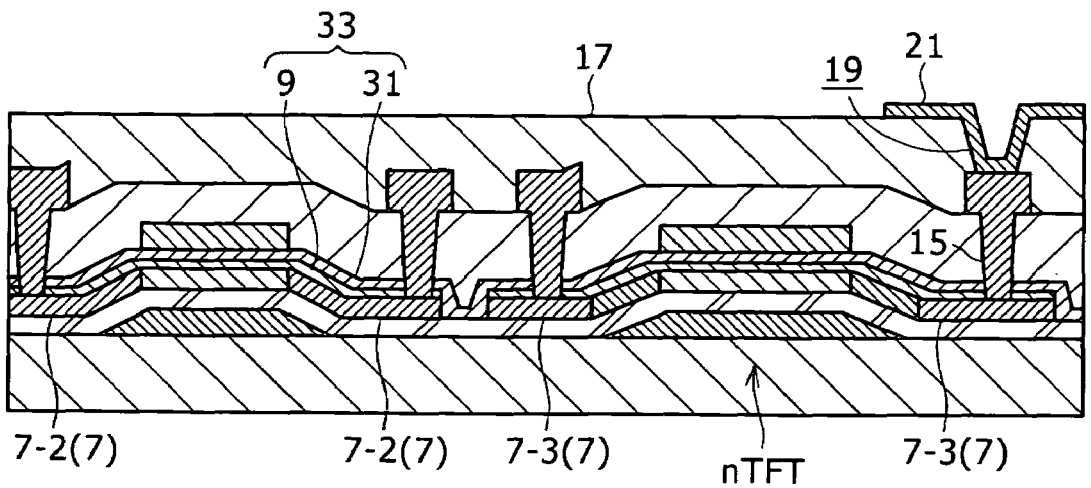

The subsequent steps, shown in FIGS. 4C to 4E, are the same as those in the first embodiment, which have been described above with reference to FIGS. 1H to 1J.

The step shown in FIG. 4C is intended to form an interlayer insulating film 11 covering the thin film transistors pTFT and nTFT of dual gate structure, which have been formed in the previous step.

The next step, shown in FIG. 4D, is intended to process the interlayer insulating film 11 to form contact holes 13 therein, which reach the source-drain 7-2 and 7-3 or the semiconductor thin film 7. Then, the contact holes 13 are plugged with wiring electrodes 15, which reach the source-drain 7-2 and 7-3.

The next, step shown in FIG. 4E, is coating with a planarized insulating film 17, which is subsequently processed to form therein a contact hole 19 reaching the wiring electrode 15 of the thin-film transistor nTFT as the pixel transistor. Then, the contact hole 19 is plugged with a pixel electrode 21 for connection to the wiring electrode 15.

Thus, the foregoing steps complete the drive panel. On the drive panel, the display unit is subsequently formed in the same way as used in the first embodiment.

The third embodiment is as effective as the first one because it involves steam annealing under pressure which is carried out, with the semiconductor thin film 7 formed on the SiON gate insulating film 5, as illustrated by FIG. 1C in the latter.

Since the pTFT and nTFT of dual gate structure described in the third embodiment have channels on both sides of the channel layer 7, they generate a larger ON current than the TFT of single gate structure at the same gate voltage. In addition, they have part of the upper gate insulating film 33 in contact with the semiconductor thin film 7 formed from the thermal oxide film 9, so that they keep low the interface states between the upper gate insulating film 33 and the semiconductor thin film 7, even though the upper insulating film 31 as a constituent of the upper gate insulating film 33 is formed from silicon oxynitride or silicon nitride, which are liable to induce defect levels.

All the embodiments mentioned above are concerned with TFTs in which the gate insulating film underneath the semiconductor thin film 7 is the SiON gate insulating film 5 of a single-layer structure. However, the embodiments of the present invention are not limited to those of such structure but embraces those in which the SiON gate insulating film 5 is of a laminate structure. Even in such a case, the method of the embodiments of the present invention involves the step of growing the thermal oxide film as a protective film on the surface of the semiconductor thin film at the same time as modification of the SiON film constituting part of the gate insulating film, and hence it gives a highly reliable thin-film semiconductor device of the bottom gate type without increasing the number of steps.

It should be understood by those skilled in the art that various modifications, combinations, subcombinations and alterations may occur depending on design requirements and other factors insofar as they are within the scope of the appended claims or the equivalents thereof.

What is claimed is:

1. A method for production of a thin-film semiconductor comprising:
   a first step to form a gate electrode on a substrate;
   a second step to form a gate insulating film of silicon oxynitride on said substrate in such a way as to cover said gate electrode;
   a third step to form a semiconductor thin film on said gate insulating film; and
   a fourth step to perform heat treatment in an oxygen-containing oxidizing atmosphere for modification through oxygen binding with oxygen-deficient parts in said silicon oxynitride film constituting said gate insulating film,
   wherein the fourth step grows a thermal oxide film on the surface of said semiconductor thin film which has been formed by said heat treatment in the third step, and
   wherein fourth step is followed by an additional step to form a source-drain by patterning from said thermal oxide film in a shape overlapping said gate electrode and by further pattering from a semiconductor thin film containing impurities, said source-drain being in contact with said semiconductor thin film and said patterning being performed at a position on said semiconductor thin film under which said gate electrode exists.

2. The method for production of a thin-film semiconductor device as defined in claim 1, wherein the gate insulating film formed in the second step is a silicon oxynitride film.

3. The method for production of a thin-film semiconductor device as defined in claim 1, wherein the fourth step is heat treatment that is performed in a steam atmosphere under pressure.

4. The method for production of a thin-film semiconductor device as defined in claim 1, wherein the fourth step is followed by an additional step to form an upper gate insulating film on said semiconductor thin film and then form an upper gate electrode above said gate electrode, with said upper gate insulating film interposed between them.

5. The method for production of a thin-film semiconductor device as defined in claim 1, wherein the fourth step is followed by an additional step to perform patterning on said semiconductor thin film through said thermal oxide film as a protective film.

6. The method for production of a thin-film semiconductor device as defined in claim 1, wherein the fourth step is followed by an additional step to form an upper gate electrode above said gate electrode and on said thermal oxide film as an upper gate insulating film.

\* \* \* \* \*